US012785590B2

(12) United States Patent
Ting et al.

(10) Patent No.: US 12,785,590 B2
(45) Date of Patent: Nov. 3, 2026

(54) SHEAR DEFORMATION-TYPE BIMORPHIC PIEZOELECTRIC ACTUATOR

(71) Applicant: CHUNG YUAN CHRISTIAN UNIVERSITY, Taoyuan Ctiy (TW)

(72) Inventors: Yung Ting, Taoyuan Ctiy (TW); Sheuan-Perng Lin, Taoyuan Ctiy (TW); Suhail Abbas, Taoyuan Ctiy (TW); Chih-Hsuan Yu, Taoyuan Ctiy (TW)

(73) Assignee: CHUNG YUAN CHRISTIAN UNIVERSITY, Taoyuan City (TW)

( * ) Notice: Subject to any disclaimer, the term of this patent is extended or adjusted under 35 U.S.C. 154(b) by 816 days.

(21) Appl. No.: 18/140,046

(22) Filed: Apr. 27, 2023

(65) Prior Publication Data

US 2024/0079972 A1 Mar. 7, 2024

(30) Foreign Application Priority Data

Jun. 29, 2022 (TW) ................................. 111124275

(51) Int. Cl.
*H02N 2/00* (2006.01)
*H10N 30/20* (2023.01)

(52) U.S. Cl.
CPC ......... *H02N 2/0045* (2013.01); *H10N 30/208* (2023.02)

(58) Field of Classification Search
CPC .......... H02N 2/106; H02N 2/04; H02N 2/045; H10N 30/208
See application file for complete search history.

(56) References Cited

U.S. PATENT DOCUMENTS 4,523,120 A * 6/1985 Assard ................. H02N 2/0025 310/317
5,268,611 A 12/1993 Culp
(Continued)

FOREIGN PATENT DOCUMENTS

CN 102075112 B 6/2012
CN 112054713 A 12/2020

OTHER PUBLICATIONS

Search Report for TW111124275 mailed Apr. 26, 2023.
Ting, Y. et al., Sensors and Actuators A, (2019), 290: 62-70.
Ting, Y. et al., J. Eur. Ceram. Soc., (2014), 34: 2857-2864.

*Primary Examiner* — J. San Martin
(74) *Attorney, Agent, or Firm* — Demian K. Jackson; Jackson IPG PLLC

(57) ABSTRACT

The present invention relates to a shear deformation-type bimorphic piezoelectric actuator. The actuator includes at least a pair of shear deformation-type piezoelectric ceramic members which are polarized in the height direction thereof, coated with metal electrodes on both sides thereof and attached to opposite sides of a metal block to constitute a piezoelectric bimorph. The ceramic members are forced to undergo a face shear deformation or a resonance deformation upon receiving a driving voltage, whereby the metal block and the output head mounted thereon are driven to generate an elliptical motion, which in turn drives a rotor or a carriage to move. Taking advantage of the small dimension of the ceramic members and the enhanced displacement attributed to the piezoelectric bimorph structure, the piezoelectric actuator disclosed herein is suitable for manufacturing a miniature piezoelectric motor with high power output.

13 Claims, 6 Drawing Sheets

(56) References Cited

U.S. PATENT DOCUMENTS

| | | | | |
|---|---|---|---|---|
| 8,445,837 | B2 * | 5/2013 | Matsukawa | G02B 27/646 310/323.01 |
| 9,219,221 | B2 * | 12/2015 | Funakubo | H10N 30/875 |
| 10,199,959 | B2 | 2/2019 | Ting et al. | |
| 2005/0082947 | A1 * | 4/2005 | Li | H02N 2/004 310/328 |
| 2007/0138915 | A1 * | 6/2007 | Mulvihill | A61B 17/320758 310/328 |
| 2010/0019621 | A1 * | 1/2010 | Funakubo | H02N 2/006 310/323.16 |

* cited by examiner

SHEAR DEFORMATION-TYPE BIMORPHIC PIEZOELECTRIC ACTUATOR

CROSS REFERENCE TO RELATED APPLICATION

This application claims priority to R.O.C. Patent Application No. 111,124,275 filed Jun. 29, 2022, which is hereby incorporated by reference in its entirety.

BACKGROUND OF THE INVENTION

Field of the Invention

The present invention relates to a piezoelectric actuator, particularly to a piezoelectric actuator that is adapted to generate a driving force through cooperative shear deformation of at least one pair of d14 ceramic members, and to a piezoelectric motor incorporating same.

Description of Related Art

A piezoelectric motor is a driving tool operating based on the principle that piezoelectric material undergoes a deformation when subjected to an electric field (i.e., the inverse piezoelectric effect). It has the advantages of small size, light weight, quick response, no electromagnetic interference and high precision, and has been widely used in various technical fields including aerospace, optics, medicine and microelectromechanical systems. Materials with piezoelectric effect include natural crystals such as quartz, tourmaline, tantalates, niobates and Rochelle salt, ceramic materials such as barium titanate ($BaTiO_3$) and lead zirconate titanate (PZT), and piezoelectric polymer materials. Ceramic materials are currently the mainstream of piezoelectric materials due to their ease of manufacture and shaping.

From the perspective of the types of the inverse piezoelectric effects and the types of deformation induced, ceramic materials can generally be classified into two categories: (1) those which undergo a deformation in the length or width in response to an electric field applied along the polarization direction of the ceramics (d31 and d33 piezoelectric ceramics); and (2) those whose two opposite surfaces undergo parallel displacement relative to each other, i.e., a shear deformation, in response to an electric field applied along a direction orthogonal to the polarization direction of the ceramics (d14 and d15 piezoelectric ceramics). Among them, d15, d31 and d33 piezoelectric ceramics have been widely used as piezoelectric actuators, while d15 piezoelectric ceramics which are actuated in light of shear deformation typically generate greater output and have higher driving efficiency as compared with d31 and d33 piezoelectric ceramics. For example, China Patent No. CN102075112B discloses a piezoelectric actuator based on d15 ceramics.

However, as shown in FIG. 1, a d15 piezoelectric ceramic member 300 has a height h equal to the distance between the driving electrodes. When a voltage is applied to the driving electrode surfaces, a shear deformation occurs in the thickness direction. To increase the shear deformation of the ceramic member, the height h of the ceramic member has to be increased and this will change the distance between the electrodes. In order to maintain the intensity of the electric field during the driving of the piezoelectric ceramic member 300 (which is equal to the driving voltage divided by the thickness, or $E=V/t$), the driving voltage has to be elevated, and this may cause problems such as excessive voltage. In addition, as shown in FIG. 1, the output surface 310 of the d15 piezoelectric ceramic member 300 functions as a driving surface as well, which makes it difficult to establish an electrical connection to the driving electrode. To solve these problems, U.S. patent Ser. No. 10/199,959 B2 assigned to the present assignee, and Ting, Y. et al., Investigation and performance evaluation of a d14 ceramic actuator, *J. Eur. Ceram. Soc.*, (2014), 34: 2857-2864, proposed a piezoelectric actuator based on a d14 ceramic member which includes a rectangular output surface and two driving surfaces different from the output surface, where the output surface has a thickness smaller than its height, and an elliptical motion deformation is generated on the output surface in response to the application of a pulsed drive voltage to the driving surfaces. Ting, Y. et al., Design a composite piezoelectric motor using face-shear and longitudinal resonance vibration, *Sensors and Actuators A*, (2019), 290: 62-70 further proposed combining a d14 ceramic member with a different type of ceramic member to create a composite piezoelectric vibrator. The patents and journal articles mentioned above are incorporated herein by reference. Compared to the d15 actuator, the d14 piezoelectric actuator can increase the shear deformation by increasing the height of the ceramic member, without the necessity of increasing the driving voltage. Furthermore, its size is smaller, which is advantageous for miniaturization.

While the development of the aforementioned d14 piezoelectric actuators has achieved significant success, there is still a need in the art for a piezoelectric actuator with larger deformation but smaller size, in a bid to produce a micro piezoelectric motor with higher output power.

SUMMARY OF THE INVENTION

In response to the industrial need described above, the invention provides a piezoelectric actuator based on d14 ceramics. The invented actuator comprises a pair of d14 ceramic members as the piezoelectric vibrators, which are attached to two opposite sides of a cubic or cuboid metal block to constitute a piezoelectric bimorph. By applying a driving voltage, this pair of d14 ceramic members can be made to cooperatively undergo either a face shear deformation or a face resonance deformation, which in turn drives the metal block and the output head located thereon to generate an elliptical motion, thus providing improved output power. Taking advantage of the small thickness and volume of the d14 piezoelectric ceramic members and the enhanced displacement and speed attributed to the piezoelectric bimorph structure, the invention is suitable for manufacturing miniature piezoelectric actuators and micro piezoelectric motors with high output power.

Therefore, in an aspect provided herein is a piezoelectric actuator based on d14 ceramics. The piezoelectric actuator comprises:

- a metal block comprising two oppositely arranged side surfaces, an upper surface connecting the two side surfaces, and a lower surface arranged opposite to the upper surface;
- a first pair of ceramic members, each comprising a first driving surface, a second driving surface arranged opposite to and separate from the first driving surface by a thickness, an output surface connecting the first driving surface to the second driving surface, and a fixed surface arranged opposite to and separate from the output surface by a height, wherein the thickness is shorter than the height, and wherein the first driving surface is coated with a first electrode and a second electrode arranged side-by-side with each other, and the second driving surface is coated with a counter electrode, with the first electrodes of the first pair of ceramic members being electrically connected to each other, and the second electrodes of the first pair of ceramic members being electrically connected to each other, and the first electrodes being electrically insulated from the second electrodes, and wherein the first pair of ceramic members are polarized along a polarization direction orthogonal to the thickness direction and attached at the second driving surfaces thereof to the two side surfaces of the metal block, respectively, so that the counter electrodes are electrically connected to the metal block; and an output head protruding outward from the upper surface of the metal block.

In a preferred embodiment, the metal block further comprises oppositely arranged front and rear surfaces connected with the two side surfaces, the upper surface and the lower surface. The piezoelectric actuator further comprises a second pair of ceramic members which are structurally identical to the first pair of ceramic members. The second pair of ceramic members are attached to the front and rear surfaces, respectively, via their second driving surfaces.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Unless specified otherwise, the following terms as used in the specification and appended claims are given the following definitions. It should be noted that the indefinite article "a" or "an" as used in the specification and claims is intended to mean one or more than one, such as "at least one," "at least two," or "at least three," and does not merely refer to a singular one. In addition, the terms "comprising/comprises," "including/includes" and "having/has" as used in the claims are open languages and do not exclude unrecited elements. The term "or" generally covers "and/or", unless otherwise specified. The terms "about" and "substantially" used throughout the specification and appended claims are used to describe and account for small fluctuations or slight changes that do not materially affect the nature of the invention.

Figure 1:
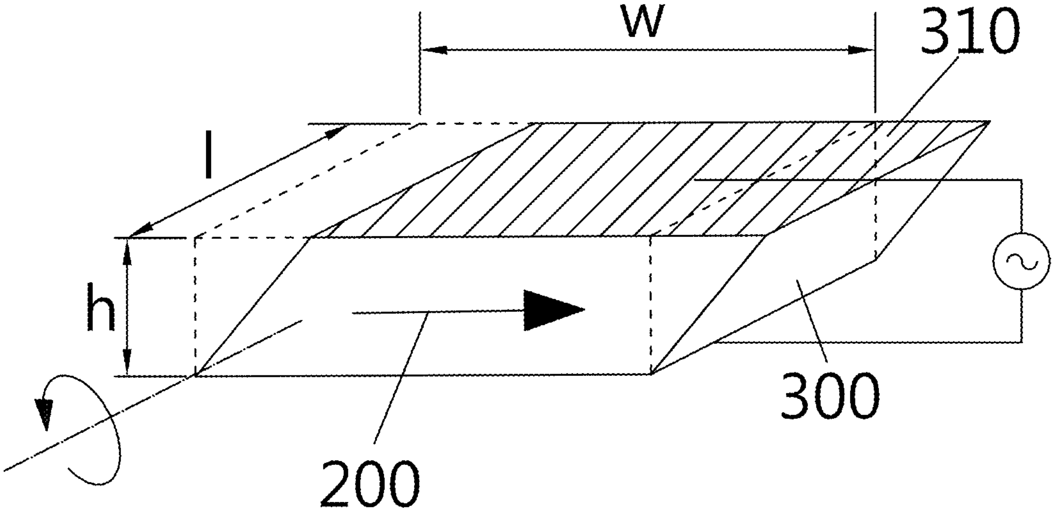
FIG.1 PRIOR ART
FIG. 1 is a schematic diagram showing that a conventional d15 piezoelectric actuator undergoes deformation upon receiving a voltage.
Figure 2:
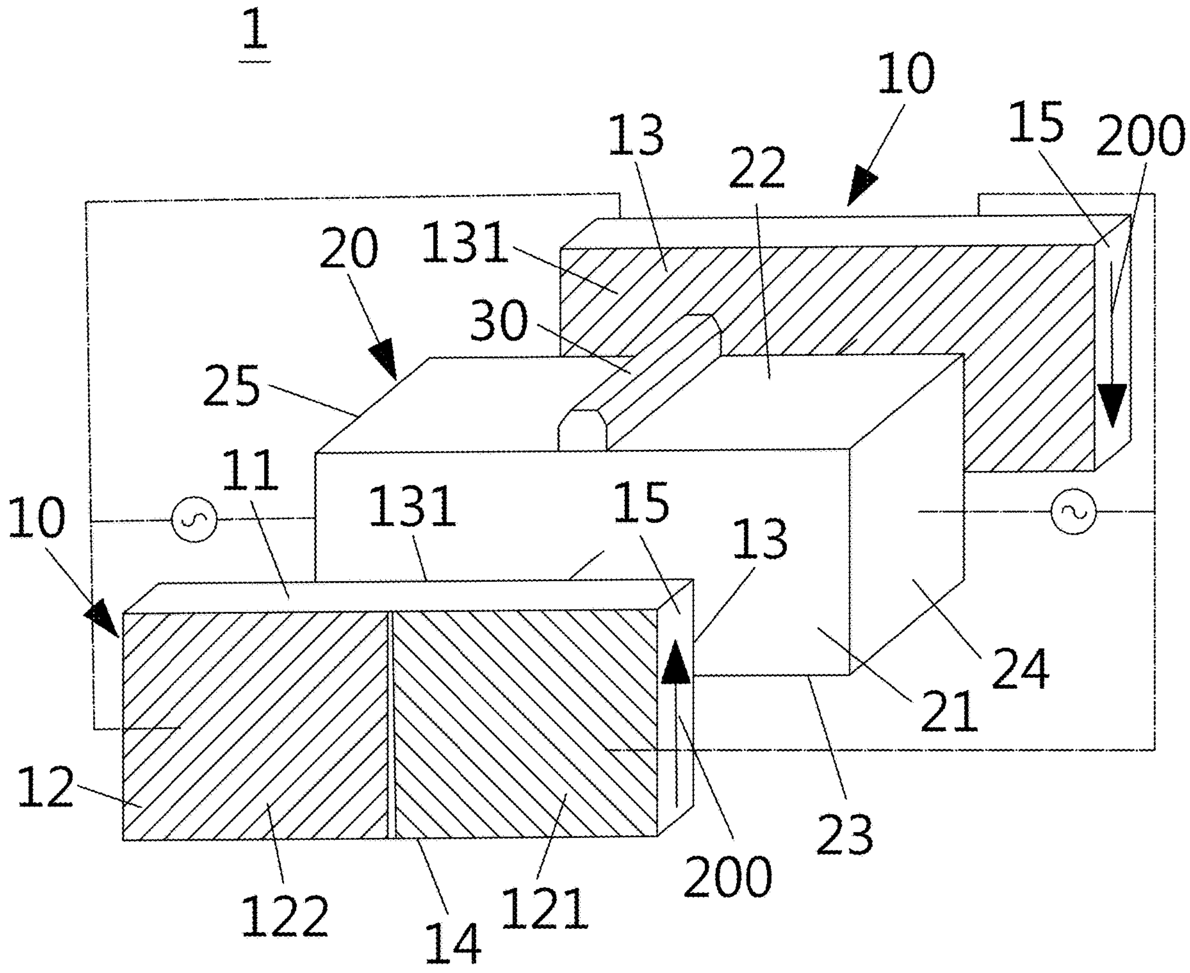
FIG. 2 is a schematic diagram of a piezoelectric actuator according to the first preferred embodiment of the invention.

FIG. 2 shows a piezoelectric actuator 1 according to the first preferred embodiment of the invention, which comprises a pair of d14 ceramic members 10, a metal block 20 and an output head 30.

Figure 3:
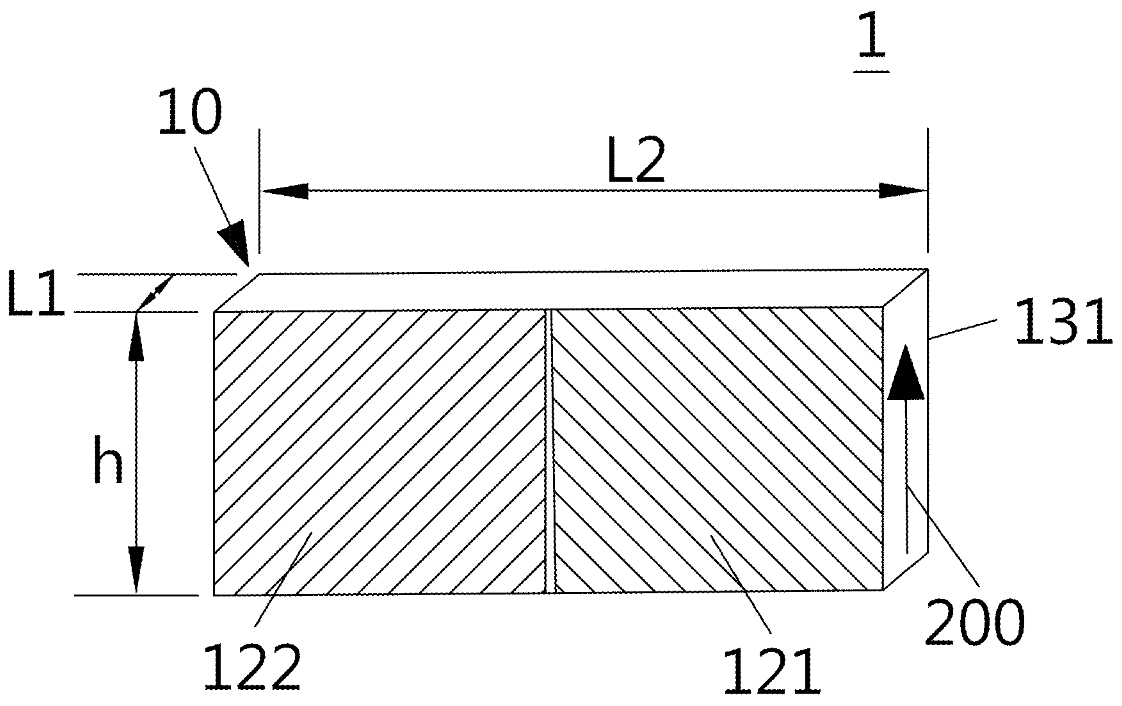
FIG. 3 is a schematic diagram of a d14 piezoelectric ceramic member according to the first preferred embodiment of the invention.

FIG. 3 shows a schematic diagram of the piezoelectric ceramic member 10, which comprises an output surface 11 and two oppositely arranged driving surfaces 12 and 13. In this embodiment, the output surface 11 is rectangular in shape and has a short side L1 and a long side L2, while the two driving surfaces 12 and 13 are respectively connected to the two long sides L2 of the output surface 11. The fixed surface 14 is arranged opposite to the output surface 11 and used to anchor the ceramic member 10 on a motor (not shown). Preferably, the ceramic member 10 is configured in form of a cubic or cuboid board, where the two driving surfaces 12 and 13 are spaced apart by a thickness equal to the short side L1, and the output surface 11 is spaced apart from the fixed surface 14 by a height h. In this embodiment, the length of the long side L2 of the output surface 11 is substantially equal to the height h of the ceramic member 10, whereas the length of the short side L1 of the output surface 11 (i.e., the thickness of the ceramic member 10) is substantially smaller than the height h.

Figure 4:
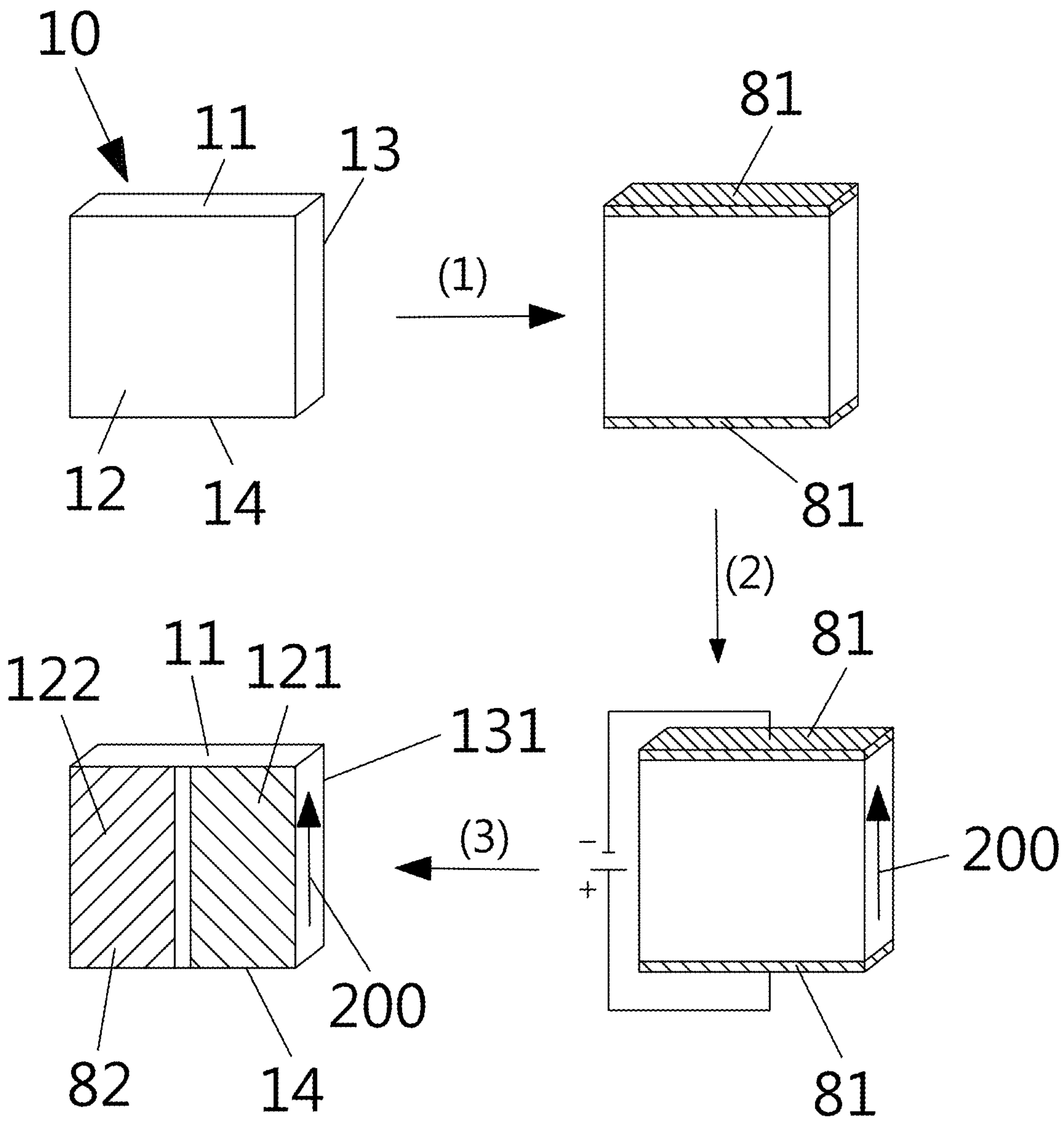
FIG. 4 is a schematic flowchart showing the process for manufacturing the piezoelectric ceramic member according to the first preferred embodiment of the invention.

As shown in FIG. 4, the ceramic member 10 of the piezoelectric actuator 1 according to the invention is produced as follows: Step 1: coating a polarizing electrode 81 on the output surface 11 and the fixed surface 14 of the ceramic member 10, respectively; Step 2: applying a DC voltage along a direction perpendicular to the output surface 11, so that the ceramic member 10 is polarized in a polarization direction 200 which is orthogonal to the thickness L1; Step 3: removing the polarizing electrodes 81 from the output surface 11 and the fixed surface 14; and Step 4: coating a layer of electrode material, such as silver paste, onto the driving surfaces 12 and 13 of the ceramic member 10 to form a first electrode 121, a second electrode 122 and a counter electrode 131.

The metal block 20 is generally in form of a cubic or cuboid body and comprises two side surfaces 21 arranged opposite to and preferably parallel to each other, on which the second driving surfaces 13 of the ceramic members 10 are attached. The metal block 20 includes an upper surface 22 connecting the two side surfaces 21, and a lower surface 23 arranged opposite to and preferably parallel to the upper surface 22. The metal block 20 further comprises a front surface 24 and a rear surface 25 which are arranged opposite to and preferably parallel to each other. The front surface 24 and the rear surface 25 are connected with, and preferably arranged perpendicular to, the two side surfaces 21, the upper surface 22 and lower surface 23, respectively. According to the invention, the metal block 20 combines with at least one pair of oppositely arranged piezoelectric ceramic members 10 to constitute a piezoelectric bimorph. When the pair of ceramic members 10 deform, the metal block facilitates the occurrence of resonance to amplify the displacement, thereby causing elliptical motion of the output head 30 located on the metal block 20 and achieving the technical effect of increasing the output power. Therefore, the metal block 20 can be made of any soft metal material that can achieve this purpose. In a preferred embodiment, suitable soft metal material for producing the metal block 20 includes, but is not limited to, aluminum and aluminum alloys.

The output head 30 is arranged to protrude outward from the upper surface 22 of the metal block 20. The output head 30 serves to amplify the lateral displacement of the piezoelectric actuator 1 and provide good contact with the object to be driven. The position of the output head 30 on the upper surface 22 can be selected according to actual needs. Preferably, the output head 30 is located in the central portion of the upper surface 22 and, more preferably, at a position on the upper surface 22 corresponding to the gap between the first electrode 121 and the second electrode 122. In one embodiment, the output head 30 is integrally formed with the metal block 20. In an alternative embodiment, the output head 30 is separately made of the same or different material as the metal block 20, for example, the output head 30 can be made of alumina ceramic and then assembled onto the upper surface 22 of the metal block 20.

As shown in FIG. 2, the first driving surface 12 of the ceramic member 10 is provided with the first electrode 121 and the second electrode 122, respectively. The first electrode 121 and the second electrode 122 are arranged side by side and extend from a position near the fixed surface 14 to a position near the output surface 11. The first electrode 121 and the second electrode 122 are substantially disconnected from each other and, thus, are electrically insulated from each other. The second driving surface 13 is provided with a counter electrode 131. Upon attaching the second driving surface 13 to the side surface 21 of the metal block 20, the counter electrode 131 is electrically connected to the metal block 20 to constitute a common electrode for the input power source. The two first electrodes 121 on the pair of ceramic members 10 are connected in parallel to form a common electrode and electrically connected to a voltage source, while the two second electrodes 122 are connected in parallel to form another common electrode and electrically connected to another voltage source. As shown in FIG. 2, the pair of ceramic members 10 may be attached in such manner that one of the ceramic members 10 has a polarization direction pointing upwardly toward the output surface 11, while the other one of the ceramic members 10 has a polarization direction pointing downwardly toward the fixed surface 14.

The piezoelectric actuator 1 is driven to generate resonance on the side surfaces 15 of the ceramic members 10 upon receiving a pulse-shaped driving voltage (an AC driving electric field), thereby exciting a face shear vibration. When a voltage is applied to drive the first electrode 121 and the counter electrode 131, a composite deformation is generated, so that the mass points at the junction of the first electrodes 121 and the second electrodes 122 undergo an elliptical motion, thus providing a lateral driving force. When a voltage is applied to drive the second electrode 122 and the counter electrode 131, the elliptical motion of the mass points occurs in the opposite direction and produces a reverse driving force. Therefore, by selectively driving the first electrode 121 or the second electrode 122 with a control signal, the output head 30 is able to drive a driven object, such as a rotor or a carriage 50, to move forward or backward through friction contact with the driven object.

In practical applications, the fixed surfaces 14 of the ceramic members 10 are placed to abut from above against a preloaded spring mounted in a piezoelectric motor, so that the bottom of the piezoelectric actuator 1 is restrained to increase the displacement of the output surface 11. This also causes the output head 30 to protrude from the piezoelectric motor, so that it can come into contact with a driven object, such as a rotor or a carriage (not shown). The preloaded spring is so configured that it makes the piezoelectric motor have good contact with the driven object, whereby the propulsive force generated by the piezoelectric motor can be transmitted effectively to the driven object. The piezoelectric actuator 1 may be further provided at two sides thereof with a fixed spring, respectively, as a means to reduce the internal gap of the piezoelectric motor, thereby minimizing the output loss during operation (not shown).

Figure 5:
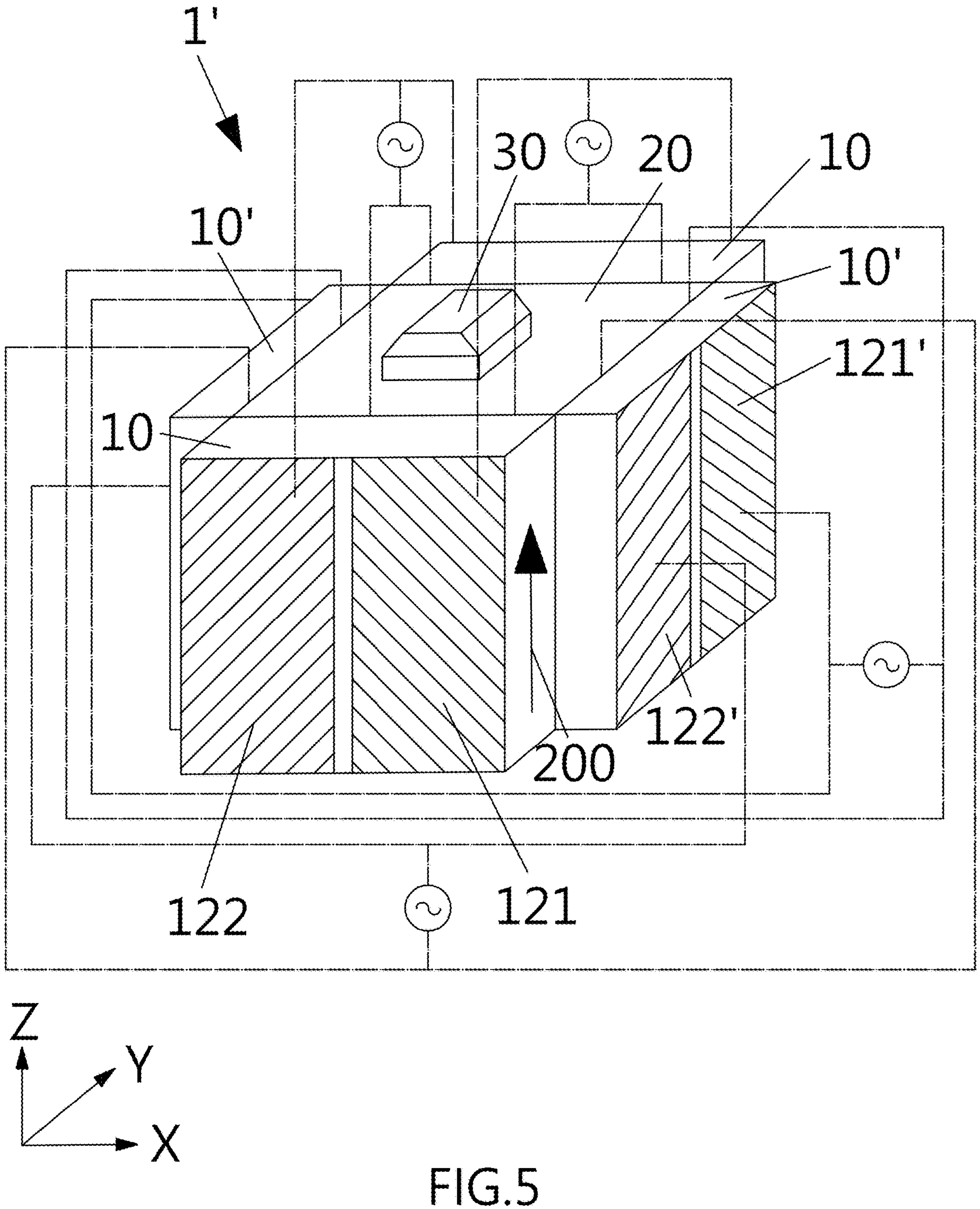
FIG. 5 is a schematic diagram of a piezoelectric actuator according to the second preferred embodiment of the invention.
Figure 6:
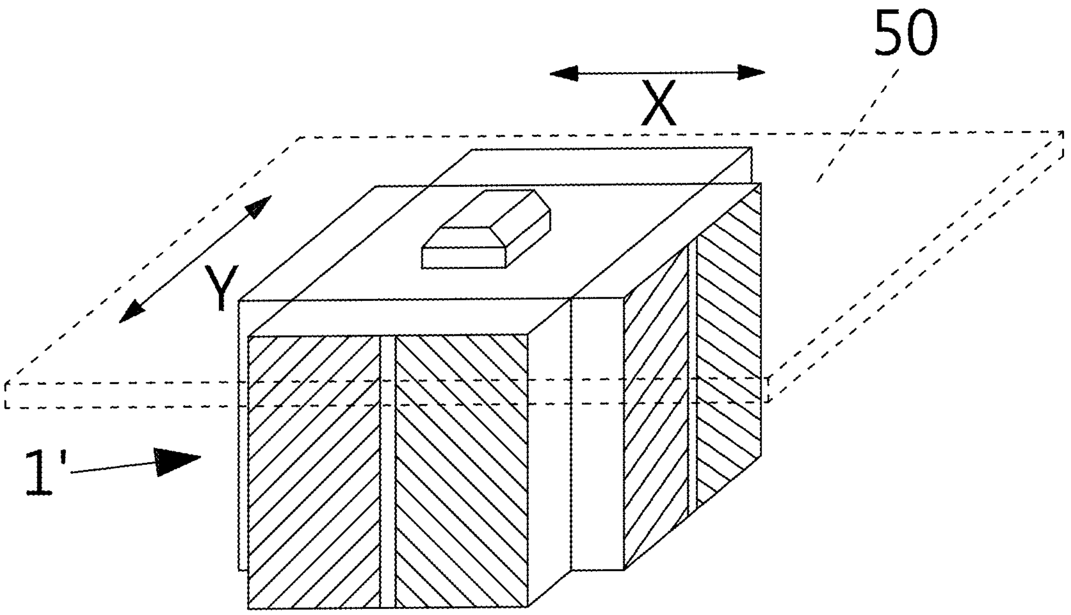
FIG. 6 is a schematic diagram showing the operation of the piezoelectric actuator according to the second preferred embodiment of the invention.

FIG. 5 is a schematic diagram of a piezoelectric actuator 1' according to the second preferred embodiment of the invention. Compared with the piezoelectric actuator 1 described in the first preferred embodiment, the piezoelectric actuator 1' not only comprises a pair of piezoelectric ceramic members 10 attached to the two side surfaces 21 of the metal block 20 but also includes an additional pair of piezoelectric ceramic members 10' attached to the front surface 24 and the rear surface 25, respectively. The ceramic members 10' are structurally identical to the ceramic members 10, but are operationally independent of the ceramic members 10 by receiving voltage from a different power source. Since the ceramic members 10 and 10' are arranged at an angle with respect to each other, for example, at an angle of about 90 degrees, the respective pairs of parallel-connected electrodes coated on the ceramic members 10 or 10' can be selectively operated by switching the driving power source to alter the direction of the elliptical motion generated by the output head 30, thereby changing the driving direction of the piezoelectric actuator 1'. For example, as shown in FIG. 6, by selectively applying voltage to the parallel-connected pair of first electrodes 121 or second electrodes 122, the pair of ceramic members 10 can be simultaneously driven to push the carriage 50 forward or backward along the X-axis direction. Similarly, by adjusting a control signal to simultaneously apply voltage to the parallel-connected pairs of electrodes 121 and/or electrodes 122 and/or electrodes 121' and/or electrodes 122' to selectively drive the pairs of ceramic members 10 and/or 10', six combinations of motions may be generated for driving the carriage 50 to move freely on a two-dimensional plane with the X-axis and Y-axis, as shown in FIG. 6.

The shear deformation-type piezoelectric actuator disclosed herein is configured in form of a piezoelectric bimorph incorporating one or more pairs of d14 ceramic members, thus achieving the effects of amplifying deformation and enhancing output power. The piezoelectric motor that incorporates the actuator herein is able to generate a high power density per unit volume or per weight (power density=Watt/Kg or Watt/$m^3$) upon receiving a small voltage. Therefore, it is very suitable for applications that require small operation space, fast operation speed, high positioning precision, low power supply and low noise, such as lens focusing mechanisms used in mobile phones and slim-type notebook computers. Moreover, the shear deformation-type bimorphic piezoelectric actuator disclosed herein has extremely simple structural arrangement and driving control circuit, which are conducive to realizing miniaturization of a piezoelectric motor.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit and scope of the invention.

What is claimed is:

1. A piezoelectric actuator comprising:

a metal block comprising two oppositely arranged side surfaces, an upper surface connecting the two side surfaces, and a lower surface arranged opposite to the upper surface;

a first pair of ceramic members, each comprising a first driving surface, a second driving surface arranged opposite to and spaced apart from the first driving surface by a thickness, an output surface connecting the first driving surface to the second driving surface, and a fixed surface arranged opposite to and spaced apart from the output surface by a height, wherein the thickness is smaller than the height, and wherein;

the first driving surface is coated with a first electrode and a second electrode arranged side-by-side with each other and extending from a position adjacent to the fixed surface toward a position adjacent to the output surface, respectively, and the second driving surface is coated with a counter electrode, the first electrodes of the first pair of ceramic members are disposed on corresponding sides of the respective ceramic members relative to the metal block and are electrically connected to each other, and the second electrodes of the first pair of ceramic members are disposed on corresponding sides of the respective ceramic members relative to the metal block and are electrically connected to each other, wherein the first electrodes are electrically insulated from the second electrodes, the first pair of ceramic members are polarized along a direction orthogonal to the thickness direction, wherein one of the ceramic members has a polarization direction from the fixed surface toward the output surface, and the other ceramic member has an opposite polarization direction from the output surface toward the fixed surface; and the second driving surfaces of the first pair of ceramic members are attached to the two side surfaces of the metal block, respectively, so that the counter electrodes are electrically connected to the metal block; and an output head protruding outward from the upper surface of the metal block, wherein, upon application of a pulse driving voltage to the electrodes, the ceramic members generate a face shear deformation that drives the metal block and the output head to produce an elliptical motion.

2. The piezoelectric actuator of claim 1, wherein the metal block further comprises oppositely arranged front and rear surfaces connected with the two side surfaces, the upper surface and the lower surface, and wherein the piezoelectric actuator further comprises a second pair of ceramic members which are structurally identical to the first pair of ceramic members, and the second pair of ceramic members are attached at the second driving surfaces thereof to the front and rear surfaces, respectively.

3. The piezoelectric actuator of claim 1, wherein the first pair of ceramic members are configured in form of a cubic or cuboid board, respectively.

4. The piezoelectric actuator of claim 3, wherein the output head is located in a central portion of the upper surface of the metal block.

5. The piezoelectric actuator of claim 4, wherein the output head is located at a position on the upper surface corresponding to a gap between the first electrodes and the second electrodes.

6. The piezoelectric actuator of claim 4, wherein the metal block is made of soft metal material selected from the group consisting of aluminum and aluminum alloys.

7. The piezoelectric actuator of claim 6, wherein the output head is integrally formed with the metal block.

8. The piezoelectric actuator of claim 2, wherein one of the first pair of ceramic members has a polarization direction pointing toward the output surface, and the other one of the first pair of ceramic members has a polarization direction pointing toward the fixed surface.

9. The piezoelectric actuator of claim 8, wherein the first pair of ceramic members are configured in form of a cubic or cuboid board, respectively.

10. The piezoelectric actuator of claim 9, wherein the output head is located in a central portion of the upper surface of the metal block.

11. The piezoelectric actuator of claim 10, wherein the output head is located at a position on the upper surface corresponding to a gap between the first electrodes and the second electrodes.

12. The piezoelectric actuator of claim 10, wherein the metal block is made of soft metal material selected from the group consisting of aluminum and aluminum alloys.

13. The piezoelectric actuator of claim 12, wherein the output head is integrally formed with the metal block.

* * * * *